US006924462B2

(12) United States Patent
Bagley et al.

(10) Patent No.: US 6,924,462 B2
(45) Date of Patent: Aug. 2, 2005

(54) PEDESTAL FOR FLAT PANEL DISPLAY APPLICATIONS

(75) Inventors: William A. Bagley, San Jose, CA (US); Ericka M. Ramirez, Gilroy, CA (US); Stephen C. Wolgast, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 116 days.

(21) Appl. No.: 10/379,520

(22) Filed: Mar. 4, 2003

(65) Prior Publication Data

US 2003/0164362 A1 Sep. 4, 2003

Related U.S. Application Data

(63) Continuation of application No. 09/963,020, filed on Sep. 24, 2001, now Pat. No. 6,528,767.
(60) Provisional application No. 60/293,009, filed on May 22, 2001.

(51) Int. Cl.[7] ................................................. F27B 5/14
(52) U.S. Cl. ....................... 219/390; 219/405; 219/411; 118/724; 118/725; 118/50.1; 118/728; 392/416; 392/418
(58) Field of Search ................................ 219/390, 405, 219/411; 392/416, 418; 148/724, 725, 50.1, 728

(56) References Cited

U.S. PATENT DOCUMENTS

| | | | | |
|---|---|---|---|---|
| 4,621,936 A | * | 11/1986 | Hansson et al. ............. 401/215 |
| 4,736,508 A | | 4/1988 | Poli et al. ...................... 29/445 |
| 4,848,814 A | | 7/1989 | Suzuki et al. ................. 294/1.1 |
| 4,958,061 A | * | 9/1990 | Wakabayashi et al. ....... 219/411 |
| 5,445,486 A | | 8/1995 | Kitayama et al. ............ 414/416 |
| 5,605,574 A | | 2/1997 | Tsunashima et al. ........ 118/500 |
| 5,674,786 A | * | 10/1997 | Turner et al. ................ 437/225 |
| 5,677,824 A | | 10/1997 | Harashima et al. .......... 361/234 |
| 5,718,574 A | | 2/1998 | Shimazu ....................... 432/253 |
| 5,788,304 A | | 8/1998 | Korn et al. ................... 294/159 |
| 5,836,575 A | | 11/1998 | Robinson et al. ............ 269/317 |
| 5,850,071 A | | 12/1998 | Makiguchi et al. .......... 219/390 |
| 5,931,631 A | | 8/1999 | Bonora et al. ............... 414/416 |
| 5,984,391 A | | 11/1999 | Vanderpot et al. ........... 294/1.1 |
| 6,077,026 A | | 6/2000 | Shultz ....................... 414/744.1 |
| 6,085,670 A | | 7/2000 | Genov ........................ 108/147 |
| 6,091,498 A | | 7/2000 | Hanson et al. ............... 356/375 |
| 6,110,285 A | | 8/2000 | Kitazawa et al. ............ 118/715 |
| 6,129,546 A | * | 10/2000 | Sada ............................ 432/253 |
| 6,143,147 A | | 11/2000 | Jelinek .................... 204/298.15 |
| 6,146,504 A | * | 11/2000 | Patadia et al. ........... 204/192.12 |
| 6,187,134 B1 | | 2/2001 | Chow et al. ................. 156/345 |
| 6,193,506 B1 | | 2/2001 | Muka ........................... 432/241 |
| 6,213,704 B1 | | 4/2001 | White et al. ................. 414/217 |
| 6,256,555 B1 | | 7/2001 | Bacchi et al. ................ 700/245 |
| 6,257,827 B1 | | 7/2001 | Hendrickson et al. ....... 414/805 |
| 6,322,116 B1 | | 11/2001 | Stevens ........................ 294/64.3 |
| 6,343,183 B1 | | 1/2002 | Halpin et al. ................ 392/416 |
| 6,345,150 B1 | * | 2/2002 | Yoo ............................. 392/418 |
| 6,371,716 B1 | | 4/2002 | Byunn et al. ............ 414/416.03 |
| 6,452,195 B1 | * | 9/2002 | Smick et al. ............ 250/492.21 |
| 6,528,767 B2 | | 3/2003 | Bagley et al. ............... 219/390 |
| 2003/0067180 A1 | | 4/2003 | Hosokawa .................... 294/1.1 |
| 2003/0072639 A1 | | 4/2003 | White et al. ................. 414/217 |

FOREIGN PATENT DOCUMENTS

| | | | | |
|---|---|---|---|---|
| JP | 09-129567 | 5/1994 | ........... H01L/21/22 |
| JP | 2000-091406 | 3/2000 | ........... H01L/21/68 |
| JP | 2000-150402 | 5/2000 | ........... H01L/21/22 |
| WO | WO 02/095808 A1 | 11/2002 | ........... H01L/21/00 |

OTHER PUBLICATIONS

U.S. Appl. No. 10/376,857, filed Feb. 27, 2003, Nguyen et al.

* cited by examiner

Primary Examiner—Shawntina Fuqua
(74) Attorney, Agent, or Firm—Moser, Patterson & Sheridan LLP

(57) ABSTRACT

An apparatus for supporting a substrate in a processing system comprising a body and an upper top portion having a surface thereon adapted to minimize friction and/or chemical reactions between the substrate support and a substrate supported thereon.

31 Claims, 4 Drawing Sheets

PEDESTAL FOR FLAT PANEL DISPLAY APPLICATIONS

This is a continuation of application Ser. No. 09/963,020 filed on Sep. 24, 2001, now U.S. Pat. No. 6,528,767 which claims priority to U.S. Provisional Patent Application Ser. No. 60/293,009, filed on May 22, 2001.

BACKGROUND OF THE INVENTION

1. Field of the Invention

The present invention relates to a support member for large area glass substrates. More particularly, the invention relates to a support member for supporting large area glass substrates during high temperature processes.

2. Description of the Related Art

Thin film transistors have been made here to for on large glass substrates or plates for use in monitors, flat panel displays, solar cells, personal digital assistants (PDA), cell phones and the like. The transistors are made by sequential deposition of various films including amorphous silicon, both doped and undoped silicon oxides, silicon nitride and the like in vacuum chambers. Thin films for transistors can be deposited by chemical vapor deposition (CVD) for example. After deposition, many films used for transistor fabrication are subjected to heat processes.

CVD is a comparatively high temperature process requiring that substrates withstand temperatures on the order of 300° to 400° C. Higher temperature processes such as those above 500° C. are envisioned. CVD film processing has found wide spread use in the manufacture of integrated circuits on glass substrates. However, since glass is a dielectric material that is very brittle and is subject to warping or cracking when heated rapidly to high temperatures, care must be taken to adjust the rate of heating large areas of substrates to avoid thermal stress and resulting damage.

Systems exist currently to preheat glass substrates prior to processing and to conduct post processing heat treatment operations. Conventional heating chambers have either one or more heated shelves for heating one or a plurality of glass substrates. Glass is typically supported above a shelf on spacers to improve heat uniformity and throughput. To minimize costs, conventional spacers are typically formed from easily machined metals, such as, for example, stainless steel, aluminum, aluminum nitride, and the like. However, conventional spacers may tend to mare or otherwise damage the surface of the glass, possibly resulting in an imperfection in the glass surface. Later, during cleaving operations, the imperfections in the glass surface may result in abnormal cleaving operations causing loss of a device or breakage of a substrate.

In some cases, it is believed that portions of the spacer in contact with the glass may react with and temporarily bond to the glass. When these bonds are later broken, residues of the earlier reaction remain on the spacer potentially damaging the substrate being processed. In addition, the residue poses a risk of damage to substrates processed thereafter or may become a source of contamination within a heat treatment chamber. Moreover, the earlier residue may incite additional chemical reactions between the spacer and the glass or further degrade a spacer support surface or the lifetime of the spacer.

Therefore, there is a need for a glass support for high temperature glass-panel operations that reduces or eliminates glass damage.

SUMMARY OF THE INVENTION

A method and apparatus for supporting a substrate during a thermal process. In one embodiment, a substrate support is provided having a body and an upper top portion having a surface thereon adapted to minimize friction and/or chemical reactions between the substrate support and a substrate supported thereon.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention relates to a support member for glass substrates that is advantageously suited to reduce glass substrate damage induced by either friction, chemical reaction or a combination of friction and chemical reactions.

Figure 1:
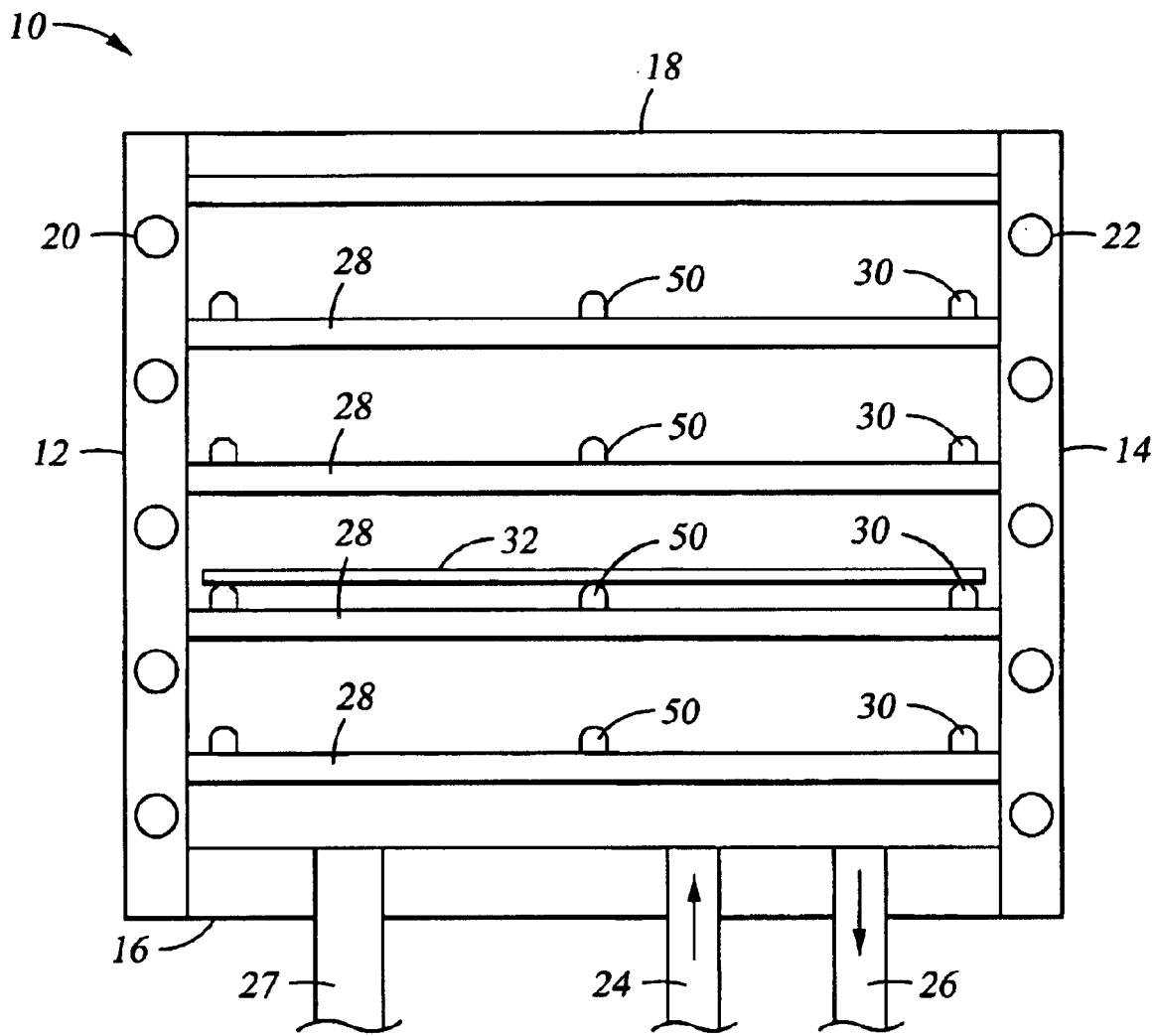
FIG. 1 is a cross sectional view of one embodiment of a heating chamber having a support member according to aspects of the invention disposed therein.

FIG. 1 illustrates an embodiment of a support member of the present invention disposed within a representative heating chamber 10. The conventional heating chamber 10 comprises side walls 12, 14, a bottom wall 16 and a lid 18. Additional side walls 13, 15, not shown in FIG. 1, are perpendicular to side walls 12, 14 completing the structure of heating chamber 10. Side wall 13, adjacent to a processing system (not shown) is fitted with a slit valve (not shown) through which the glass plates can be transferred from the processing system into and out of cassette 10.

Sidewalls 12 and 14 are fitted with suitable heating coils 20 in which gas or liquid can be circulated. The bottom wall 16 is fitted with inlet and outlet pipes 24 and 26, respectively, for circulation of temperature controlled fluid and/or channel 27 for containing wires for heating coils 20 which are connected to a source of power (not shown). Alternatively, the same channels 24, 26 can be used for both enclosing the heating coils 20 and for circulating a heat transfer medium in the channels 22. The interior of the side walls 12, 14 are fitted with a plurality of heat conductive shelves 28. The shelves 28 make good thermal contact with the walls 12, 14 to insure rapid and uniform control of the temperature of the shelves 28. Examples of materials that may be used for the shelves 28 include, but are not limited to, aluminum, copper, stainless steel, clad copper, and the like.

One or more supports 30 are suitably arranged on the shelf 28 to support the perimeter of the glass substrate 32 and a support member 50 according to embodiments of the present invention is disposed on the shelf 28 to support the central portion of the glass substrate 32. The supports 30, 50 serve to support the glass substrates 32 to be processed so that there is a gap between the shelves 28 and the glass substrates 32. This gap insures that direct contact of the shelf 28 to the glass substrates 32 is avoided which might stress and crack the glass substrates 32 or result in contaminates being transferred from shelf 28 to the glass substrates 32. Glass substrate 32 is heated indirectly by radiation and gas conduction rather than by direct contact of the glass substrate 32 and the shelves 28.

Further, the interleaving of the glass substrates 32 and the shelves 28 provides heating of the glass substrates 32 from both above and below, providing more rapid and more uniform heating of the glass substrates 32.

Figure 2:
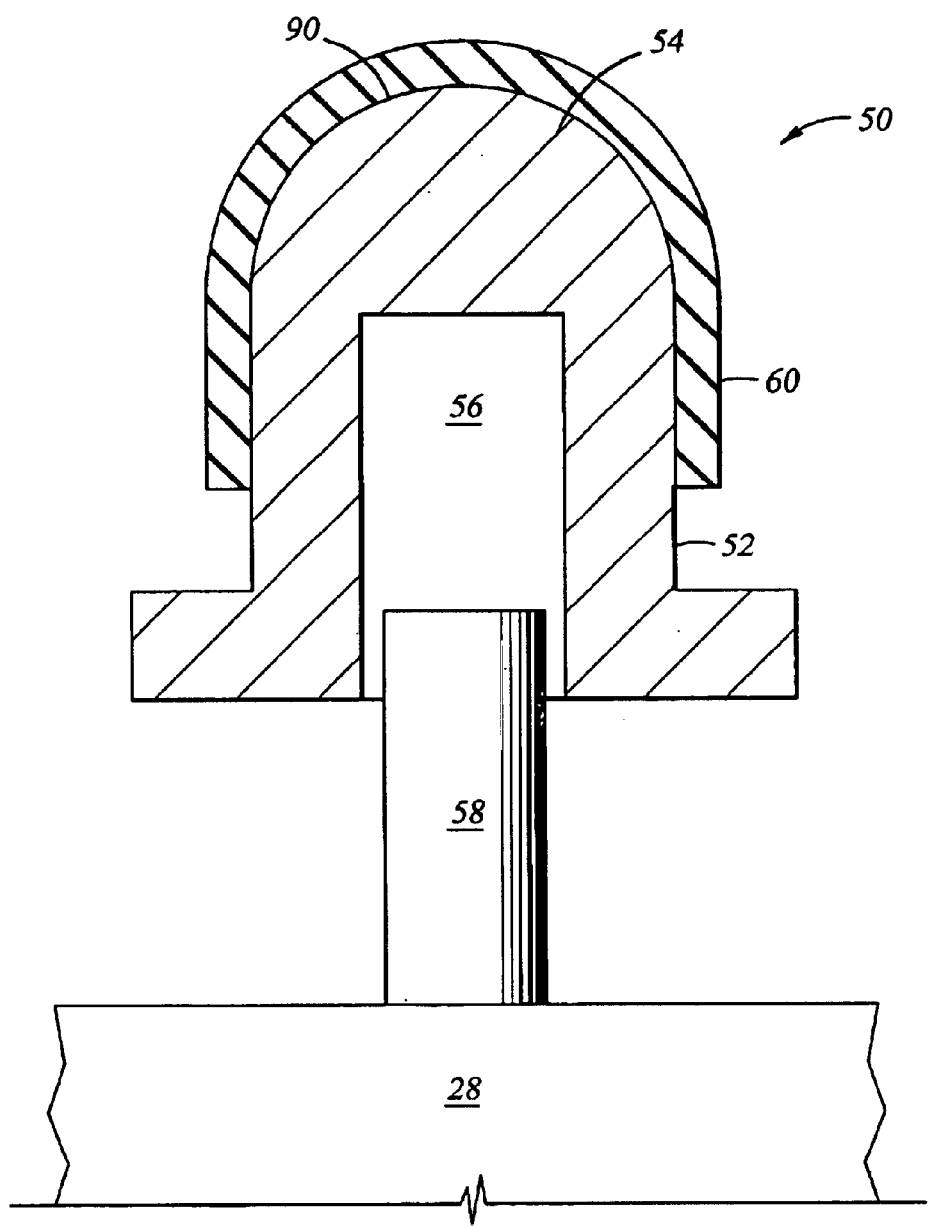
FIG. 2 is a sectional view of one embodiment of a support member according to aspects of the invention.
Figure 3:
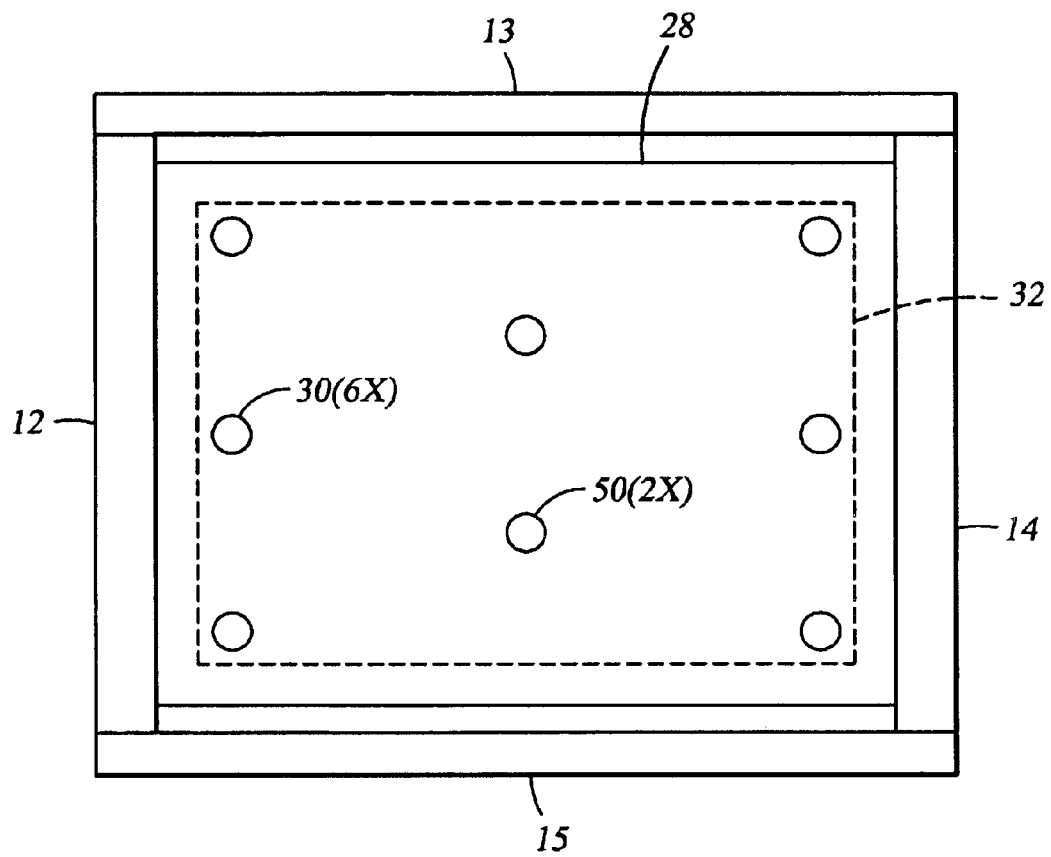
FIG. 3 is a plan view of one embodiment of a shelf having a plurality of support members.
Figure 4:
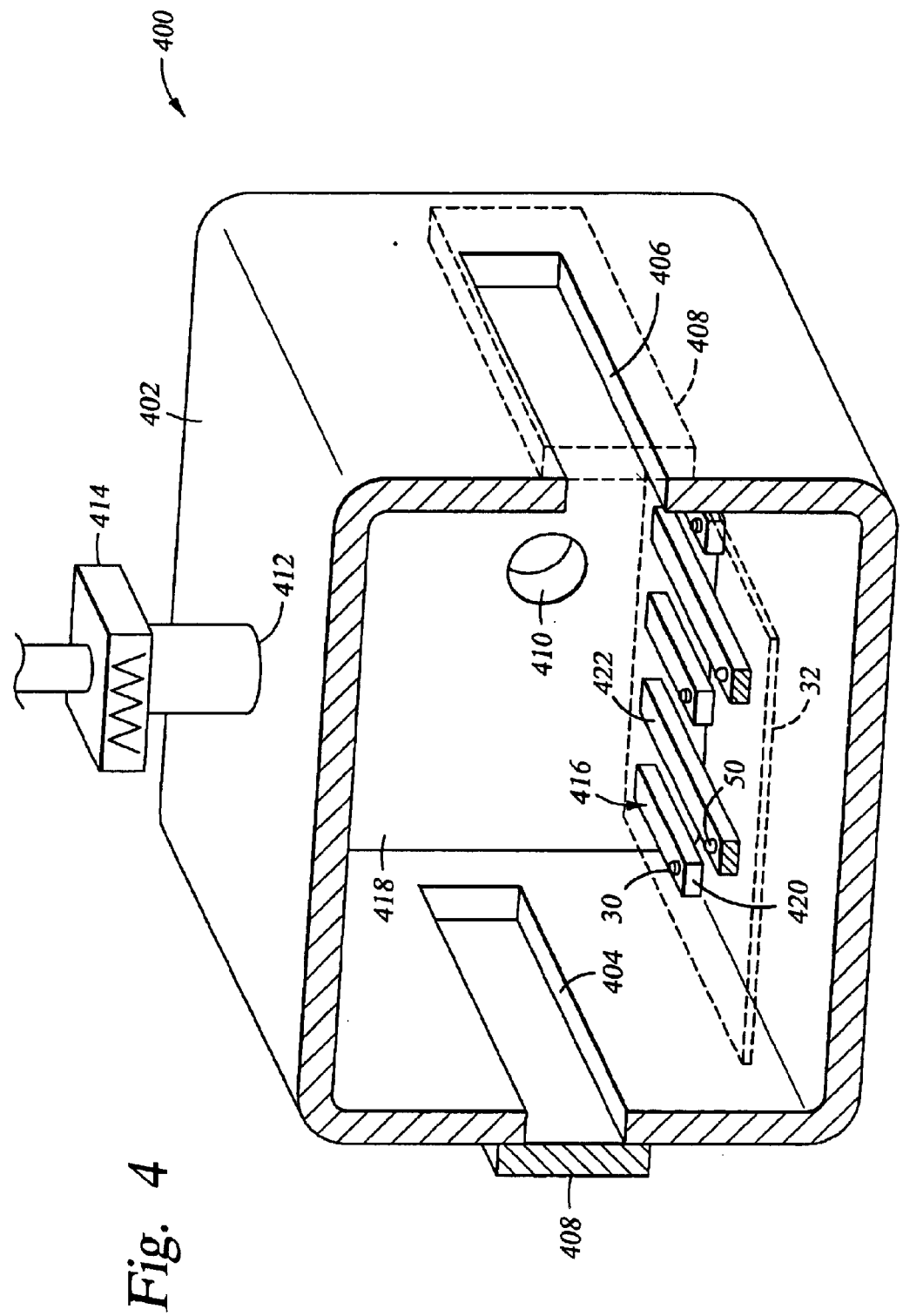
FIG. 4 is a sectional view of one embodiment of a load lock chamber of a support element having a plurality of support members.

FIG. 2 is a sectional view of one embodiment of a glass substrate support member 50 according to aspects of the present invention. The glass substrate support member 50 includes a base structural member 52 having a generally cylindrical cross section and a rounded top most portion 54. Glass substrates supported by substrate support member 50 make contact and are supported by an area adjacent or in proximity to round top most portion 54. The base structure member 52 has a hollow center 56 adaptively formed to receive mounting pin 58, thereby supporting the glass substrate support member 50 upon its representative shelf 28 inside a heat chamber 10. One advantage of using mounting pin 58 instead of mounting glass substrate support 50 directly onto shelf 28 is that material selection criteria for support member 50 and shelf 28 may differ and will likely result in selection of different materials and possible problems involving different thermal coefficients of expansion for the selected materials and related mismatch of the thermal coefficients of expansion. By using pin 58, support member 50 may expand and contract separately from the expansion and contraction of the adjacent shelf 28.

The outer surface 54 of the base structural member 52 has a rounded and smooth outer surface. The outer surface 54 may have either a machined or polished finish or other suitable finish of adequate smoothness. In a preferred embodiment, the outer surface 54 has a finish that is R4 finish smooth or better, meaning that the surface is polished to a roughness of less than 4 micro inches. In another preferred embodiment, the cross sectional shape of the glass substrate support 50 is a cylinder having a full radius upper support section 54.

The material of base structural member 52 is machined into a shape suited for supporting glass during heat treatment. In one embodiment, the section shape of base structural member 52 is generally cylindrical with a rounded top. In a preferred embodiment, the upper most portion used for supporting the glass substrates is rounded and has a smooth outer surface. Material used to form base structural member 52 is selected for ease of machining and in some embodiments, low costs. In one embodiment, the base structural member 52 is formed from stainless steel or a low carbon content stainless steel. In another embodiment, the base member structure 52 is formed from Inconel or other nickel alloys.

While embodiments of the present invention will be described as having a glass support member having a base structural member 52 formed from a metal or a metal alloy and including a coating layer 60, it is to be appreciated that other materials may be used for base structural member 52 which may not require a coating layer 60. Base structural member 52 may be formed from materials that provide the friction reducing and chemical reaction inhibiting features of the present invention. For example, base structural member 52 may be quartz or sapphire or other suitable non-metallic material that provides the advantages of the present invention. In some cases, these alternative materials may be used without surface coating 60.

Deposited over the outer surface of base structural member 52 is surface coating 60. In one embodiment, a surface coating 60 of the present invention has a sufficient thickness to function as a barrier layer to prevent contact between and reaction of contaminants of base structural member 52 and the glass substrate 32 supported by the glass substrate support member 50. In this context, contaminates could be any of a wide variety of materials, including trace materials present within base structural member 52. For example, chromium is present in many grades of stainless steel suited to be used as base structural member 32. It is believed that barrier layer embodiments of the surface coating 60 of the present invention are capable of reducing or eliminating reactions between chromium present in the base structural member 32 and a glass substrate 32.

Embodiments of a barrier layer 60 capable of reducing or eliminating reactions between the base material 52 and the glass substrate 32 include CVD nitration processes and PVD sputtering processes. For example, a base structural member 52 shaped as described above may be placed in a reaction chamber and exposed to an atmosphere comprising ammonia, and/or nitrogen and/or hydrogen and/or other reducing gasses to form a nitration layer upon the exposed surfaces of the base structural member 52. As a result of this process, a CVD nitride surface coating 60 is formed over the outer surface of the base structural member 52.

The CVD process described above or other suitable process for forming a nitride surface on the exposed surface of base structural member 52 continues until the nitride layer is sufficiently thick to reduce or prevent reaction between the base structural member 52 and the glass substrate 32. In one embodiment, the barrier layer 60 is formed by CVD to a thickness of at least about 3 microns. In another embodiment, the barrier layer 60 is formed by CVD to a thickness from between about 3 microns to about 20 microns. In an alternative embodiment of a barrier layer 60 capable of reducing or eliminating reaction between the base material 52 and the glass substrate 32 includes a barrier layer 60 sputtered onto the outer surface of the base structural member 52. In one embodiment, a barrier layer 60 is formed by a suitable physical vapor deposition (PVD) process to form a nitrated surface on the outer surface of base structural member 52. In a preferred embodiment of a surface coating layer 60, the surface coating layer 60 comprises titanium nitride and is formed by a sputtering method, such as physical vapor deposition. In another alternative embodiment of a coating layer 60 formed by physical vapor deposition, the coating layer 60 has a thickness sufficient to reduce or eliminate chemical reactions between the base structural member 52 and the glass substrate 32. In yet another alternative embodiment of the coating layer 60 of the present invention, the coating layer 60 is formed by a physical vapor deposition method and is about 3 microns thick. In yet another alternative embodiment, the PVD coating layer is between about 3 microns and about 20 microns thick. In yet another alternative embodiment, the coating layer is titanium nitride formed by sputtering or other physical vapor deposition process.

In an alternative embodiment of a surface coating 60 of the present invention, the surface coating 60 operates as a friction reduction layer between structural member 52 and the glass substrate 32. In this context, friction reduction refers to a reduction or elimination of damage to the glass substrate 32 caused by rubbing, vibration or other contact between the glass substrate 32 and the glass substrate support member 50. It is believed that embodiments of the friction reducing surface coating layer 60 of the present invention are conformable films so that the overall shape of the base structural member 50 is preserved. In a preferred embodiment of the friction reducing surface coating 60, the coating 60 is conformal and maintains a smooth polished finish of the underlining base structural member 52.

Embodiments of the surface coating 60 capable of reducing friction induced damage of glass substrates 32 include CVD nitration processes and PVD sputtering processes. For example, a base structural member 52 shaped as described above, may be placed in a reaction chamber and exposed to an atmosphere comprising ammonia, and/or nitrogen, and/or hydrogen, and/or other reducing gases to form the nitration layer on the exposed surfaces of the base structural member 52. As a result of this process, a conformal CVD nitride surface coating 60 is formed over the outer surface of base structural member 52. The CVD process described above or other suitable processes continue until the nitride layer is sufficiently thick and conformal to reduce friction damage between the glass substrate support member 50 and the glass substrate 32.

In one alternative embodiment, the friction reduction coating 60 is formed by CVD to a thickness of at least about 3 microns. In another embodiment, the friction reducing coating 60 is formed by CVD to a thickness from about 3 microns to about 30 microns.

In an alternative embodiment of a coating layer 60 capable of reducing friction damage between the support member 50 and the glass substrate 32 includes a friction reduction layer 60 sputtered onto the outer surface of base structural member 52. In one embodiment, a friction reduction layer 60 is formed by a suitable physical vapor deposition (PVD) process to form a nitrated surface over the outer surface of base structural member 52. In a preferred embodiment of a friction reduction layer 60, the coating layer 60 comprises titanium nitride and is formed by a sputtering method or a physical vapor deposition. In another alternative embodiment of a friction reducing layer 60 formed by a physical vapor deposition, the friction reducing layer 60 is conformal to the shape and polish of the base structural member 52 with a thickness sufficient to reduce friction damage of the glass substrate 32 by the support member 50.

In yet another alternative embodiment of the friction coating layer 60 of the present invention, the coating layer is formed by physical vapor deposition, is conformal to the shape and polished finish of base structural member 52 and is about 3 microns thick. In yet another alternative embodiment, the PVD coating layer is conformal and is between about 3 microns and 20 microns thick. In yet another alternative embodiment, the coating layer is a conformal titanium nitride layer formed by sputtering or physical vapor deposition.

It is to be appreciated that regardless of formation method, the surface coating 60 is conformal to the smooth outer surface of base structural member 52. It is believed that the alternative embodiments described above of the surface coating 60 maintain a smooth surface as the original finish of base structural member 52. It is also believed that glass substrate support members 50, formed according to the present invention and having a surface coating 60 described above, will reduce the friction between the glass substrate supported on the member and in some embodiments also reduce chemical reactions between metals or other contaminants within base structural member 52 and the glass 32 being heat treated.

It is to be appreciated that a glass support member 50 fabricated in accordance with aspects of the present invention is suited for heat treatment operations conducted above 250° C. Other heat treatment operations may also be performed using the glass support member 50 of the present invention, such as the heat treatment processes used in the fabrication of low temperature poly silicon. It is believed that glass support members fabricated in accordance with the present invention are suited for heat treatment operations conducted above about 450° C. up to and including 600° C., depending upon the application and glass material properties. It is believed that surface coating 60 described above provides a protective layer that both reduces the likelihood of friction damage between the base structural member 52 and the glass substrate to be supported while also acting as a barrier layer to prevent reaction between either contaminants or metals within base structural member 52 and the glass substrate 32.

Embodiments of the support member 50 have been shown and described above as a center support to reduce damage that may result in abnormal cleaving operations or active area damage that may adversely impact device yield. The embodiments described above illustrate a glass support member 50 as a center support while conventional support members 30 are used for support of the periphery of glass panel 32. It is to be appreciated that the glass support member 50 of the present invention may also be used to advantage as both the center and edge supports for high temperature glass processes sequences. As a result of using glass support members 50 as both centered and edge supports, glass substrate 32 damage may be reduced or eliminated, thereby increasing the yield of a given glass substrate.

While the glass substrate support member 50 has been described with regard to particular materials and impurities, it is to be appreciated that other heat treatment applications may require base structural supports 52 fabricated from other, different materials, thereby requiring alternative coating layers 60 to act as a barrier layer to other different impurities as those described above.

While the invention has been described for use with glass substrates, other embodiments of the substrate support member 50 of the present invention may be used to reduce friction damage and chemical reaction between the support member 50 and a different substrate materials. For example, a coating 60 may be selected to prevent the diffusion of base material 52 impurities into alternative substrate types, such as, for example, plastic substrates. While the present invention has been described as used in a heating system 10 described above, other heat treatment systems and chambers may be used. For example, resistive heaters may be incorporated directly into shelves 28 to provide heating and temperature controls of glass substrates 32 to be processed therein. Methods and apparatus of the present invention may be practiced independently and irrespective of the type of heat chamber in which embodiment of the present invention is employed.

While the design of a hollow center 56 and a mounting pin 58 have been described above with their beneficial application to accommodate for thermal expansion mismatch, glass support member 50 may be attached to shelf 28 using other means. Other forms of mechanical attachment, such as cold pressing, for example, may be used to attach glass support member 50 to a shelf 28. It is to be appreciated that the method of attaching or fixing embodiments of the glass support member 50 to the heating shelf 28 are contemplated.

While the coating layer 60 described and illustrated above is shown in the upper portion 54 and covering only a portion of the base structural member 52, it is to be appreciated that other degrees of coating may be used. For example, coating layer 60 may cover all exposed portions of base structural member 52 or may be used only to cover the upper portion 54. In some embodiments, coating layer 60 may cover all surfaces of the base structural member 52 including those in contact with the shelf 28. In preferred embodiments, the amount of coating 60 applied to base structural member 52 is optimized to provide the chemical and/or friction reducing advantages of the present invention.

While the foregoing is directed to embodiments of the present invention, other and further embodiments of the invention may be devised without departing from the basic scope thereof, and the scope thereof is determined by the claims that follow.

What is claimed is:

1. An apparatus for supporting a glass substrate, comprising:
    a support element attachable to a chamber sidewall; and
    a plurality of support members disposed on an upper surface of the support element, the support members adapted to support the glass substrate in a spaced-apart relation to the support element, at least one of the support members comprising a surface coating at least partially disposed thereon,
    wherein the support members comprise a rounded top portion having a surface roughness of 4 micro inches or smoother.

2. The apparatus of claim 1, wherein at least one of the support members comprises a base structural portion disposable about a mounting pin, the mounting pin coupled to the upper surface of the support element.

3. The apparatus of claim 2, wherein the base structural member is hollow and receives at least a portion of the mounting pin.

4. The apparatus of claim 1, wherein the rounded top portion further comprises a hemispherical, conical, ellipsoidal or parabolic end.

5. The apparatus of claim 1, wherein at least one of the support members comprises a non-metallic material.

6. The apparatus of claim 1, wherein at least one of the support members comprises quartz or sapphire.

7. The apparatus of claim 1, wherein at least one of the support members comprises stainless steel or nickel alloy.

8. The apparatus of claim 1, wherein the surface coating comprises a material that reduces friction, reduces adhesion, and that is chemically inert with the glass substrate.

9. An apparatus for supporting a glass substrate, comprising:
    a support element attachable to a chamber sidewall; and
    a first set of support members disposed on an upper surface of the support element and arranged to support a perimeter of the glass substrate placed thereon;
    a second set of support members disposed on the upper surface of the support element and arranged to support a central portion of the glass substrate,
    wherein the first and the second support members are adapted to support the glass substrate in a spaced-apart relation to the support element, and
    wherein the second set of support members each comprise a surface coating at least partially disposed thereon.

10. The apparatus of claim 9, wherein the surface coating has a surface roughness of 4 micro inches or smoother.

11. The apparatus of claim 9, wherein at least one of the support members comprises a base structural portion disposable about a mounting pin, the mounting pin coupled to the upper surface at the support element.

12. The apparatus of claim 11, wherein the base structural member is hollow and receives at least a portion of the mounting pin.

13. The apparatus of claim 9, wherein the surface coating comprises a material that reduces friction, reduces adhesion, and that is chemically inert with the glass substrate.

14. An apparatus for supporting a glass substrate, comprising:
    a shelf; and
    a plurality of support members disposed on an upper surface of the shelf and arranged to support the glass substrate in a spaced-apart relation to the shelf, the support members comprising a surface coating at least partially disposed thereon, wherein the surface coating comprises a material that reduces friction, reduces adhesion, and that is chemically inert with the glass substrate.

15. The apparatus of claim 14, wherein the support members each comprise a base structural portion disposable about a mounting pin, the mounting pin coupled to the upper surface of the shell.

16. The apparatus of claim 14, wherein the support members comprise a rounded top portion having a surface roughness of 4 micro inches or smoother to minimize friction with the glass substrate.

17. The apparatus of claim 14, wherein the surface coating comprises a nitride layer to minimize friction and reduce chemical reaction with the glass substrate.

18. An apparatus for supporting a glass substrate, comprising:
    a support element attachable to a chamber sidewall; and
    a plurality of support members disposed on an upper surface of the support element, the support members adapted to support the glass substrate in a spaced-apart relation to the support element, at least one of the support members comprising a surface coating at least partially disposed thereon,
    wherein the surface coating comprises a nitride layer to minimize friction and reduce chemical reaction with the glass substrate, and
    wherein the support members comprise a rounded top portion having a surface roughness of 4 micro inches or smoother.

19. The apparatus of claim 14, wherein the surface coating comprises titanium nitride.

20. The apparatus of claim 18, wherein the surface coating comprises titanium nitride.

21. A method for supporting a glass substrate, comprising:
    disposing the glass substrate on a support element having a plurality of support members disposed on an upper surface thereof, wherein the support members are adapted to support the glass substrate in a spaced-apart relation to the support element, wherein at least one of the support members comprises a surface coating at least partially disposed thereon, and wherein at least one of the support members comprises a rounded top portion having a surface roughness of 4 micro inches or smoother.

22. The method of claim 21, wherein the surface coating comprises a nitride layer.

23. The method of claim 21, wherein the surface coating comprises titanium nitride.

24. The method of claim 21, wherein the support element comprises:
- a first set of support members arranged to support a perimeter of the glass substrate placed thereon; and
- a second set of support members arranged to support a central portion of the glass substrate, wherein the first and the second support members are adapted to support the glass substrate in a spaced-apart relation to the support element.

25. The method of claim 24, wherein the support members of the second set each comprise the surface coating at least partially disposed thereon.

26. The method of claim 21, wherein at least one of the support members comprises a base structural portion disposable about a mounting pin, the mounting pin coupled to the upper surface of the support element.

27. The method of claim 24, wherein the base structural member is hollow and receives at least a portion of the mounting pin.

28. The method of claim 24, wherein at least one of the first set of support members comprises a base structural portion disposable about a mounting pin, the mounting pin coupled to the upper surface of the support element.

29. The method of claim 28, wherein the base structural member is hollow and receives at least a portion of the mounting pin.

30. The method of claim 24, wherein at least one of the second set of support members comprises a base structural portion disposable about a mounting pin, the mounting pin coupled to the upper surface of the support element.

31. The method of claim 30, wherein the base structural member is hollow and receives at least a portion of the mounting pin.

* * * * *

UNITED STATES PATENT AND TRADEMARK OFFICE
CERTIFICATE OF CORRECTION

PATENT NO. : 6,924,462 B2 Page 1 of 1
APPLICATION NO. : 10/379520
DATED : August 2, 2005
INVENTOR(S) : William A. Bagley et al.

It is certified that error appears in the above-identified patent and that said Letters Patent is hereby corrected as shown below:

Column 4, Line 14: Change "32" to --52--

Column 4, Line 19: Change the first instance of "32" 'to --52--

Column 8, Line 6: Change "at" to --of--

Column 8, Line 27: Change "shell" to --shelf--

Column 10, Line 1: Change "24" to --26--

Signed and Sealed this

First Day of August, 2006

JON W. DUDAS
*Director of the United States Patent and Trademark Office*